United States Patent
Ting et al.

(10) Patent No.: US 8,796,805 B2
(45) Date of Patent: Aug. 5, 2014

(54) MULTIPLE METAL FILM STACK IN BSI CHIPS

(75) Inventors: Shyh-Fann Ting, Kaohsiung (TW);
Jiech-Fun Lu, Madou Township (TW);
Ming-I Wang, Tainan (TW); Yeur-Luen Tu, Taichung (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 13/604,380

(22) Filed: Sep. 5, 2012

(65) Prior Publication Data
US 2014/0061842 A1  Mar. 6, 2014

(51) Int. Cl.
*H01L 31/00* (2006.01)
*H01L 21/00* (2006.01)
*H01L 27/146* (2006.01)
*H01L 21/768* (2006.01)

(52) U.S. Cl.
CPC ....... *H01L 27/1464* (2013.01); *H01L 21/76838* (2013.01)
USPC .............................. 257/460; 438/57; 438/669

(58) Field of Classification Search
CPC ..................... H01L 27/14636; H01L 27/1464; H01L 21/76838
USPC .............................. 438/634, 57, 669; 257/460
See application file for complete search history.

(56) References Cited

U.S. PATENT DOCUMENTS

| | | | |
|---|---|---|---|
| 7,101,726 B2* | 9/2006 | Yamamoto et al. | 438/69 |
| 8,233,066 B2* | 7/2012 | Zheng et al. | 348/294 |
| 8,426,938 B2* | 4/2013 | Park et al. | 257/459 |
| 8,435,824 B2* | 5/2013 | Tsai et al. | 438/65 |
| 8,502,389 B2* | 8/2013 | Ho et al. | 257/774 |
| 8,564,135 B2* | 10/2013 | Pyo | 257/773 |
| 2013/0105924 A1* | 5/2013 | Kobayashi et al. | 257/431 |
| 2013/0112849 A1* | 5/2013 | Shimotsusa | 250/206 |
| 2013/0153901 A1* | 6/2013 | JangJian et al. | 257/49 |

* cited by examiner

*Primary Examiner* — William D Coleman
(74) *Attorney, Agent, or Firm* — Slater and Matsil, L.L.P.

(57) ABSTRACT

A method includes forming an opening extending from a back surface of a semiconductor substrate to a metal pad on a front side of the semiconductor substrate, and forming a first conductive layer including a first portion overlapping active image sensors in the semiconductor substrate, a second portion overlapping black reference image sensors in the semiconductor substrate, and a third portion in the opening to contact the metal pad. A second conductive layer is formed over and contacting the first conductive layer. A first patterning step is performed to remove the first and the second portions of the second conductive layer, wherein the first conductive layer is used as an etch stop layer. A second patterning step is performed to remove a portion of the first portion of the first conductive layer. The second and the third portions of the first conductive layer remain after the second patterning step.

20 Claims, 8 Drawing Sheets

MULTIPLE METAL FILM STACK IN BSI CHIPS

BACKGROUND

Backside Illumination (BSI) image sensor chips are replacing front-side illumination sensor chips for their higher efficiency in capturing photons. In the formation of the BSI image sensor chips, image sensors and logic circuits are formed in a semiconductor substrate of a wafer, followed by the formation of an interconnect structure on a front side of the silicon chip.

The image sensors in the BSI image sensor chips generate electrical signals in response to the stimulation of photons. The magnitudes of the electrical signals (such as the photocurrent) depend on the intensity of the incident light received by the respective image sensors. The image sensors, however, suffer from non-optically generated signals, which include the leakage signals, thermally generated signals, dark currents, and the like. Accordingly, the electrical signals generated by the image sensors need to be calibrated, so that the undesirable signals are cancelled out from the output signals of the image sensors. To cancel the non-optically generated signals, black reference image sensors are formed, and are used to generate non-optically generated signals. The black reference image sensors, therefore, need to be blocked from receiving light signals.

The black reference image sensors are covered by a metal shield, which is formed on the backside of the semiconductor substrate, in which the image sensors are formed. Furthermore, backside metal pads are also formed on the backside of the semiconductor substrate for bonding or testing. The formation of each of the metal shield and the backside metal pads includes a deposition step and a patterning step. Accordingly, in the region that is directly over the image sensors, a metal deposition and an etch step is performed when the metal shield is formed, and a metal deposition and an etch step is performed when the backside metal pads are formed. The deposition steps and the etch steps may be performed using plasma. As a result, the image sensors may be damaged or degraded.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A multiple metal film scheme for forming a metal shield and a backside metal pad in a Backside Illumination (BSI) image sensor chip is provided in accordance with various exemplary embodiments. The intermediate stages of forming the metal shield and the backside metal pad are illustrated. The variations of the embodiments are discussed. Throughout the various views and illustrative embodiments, like reference numbers are used to designate like elements.

Figure 1:
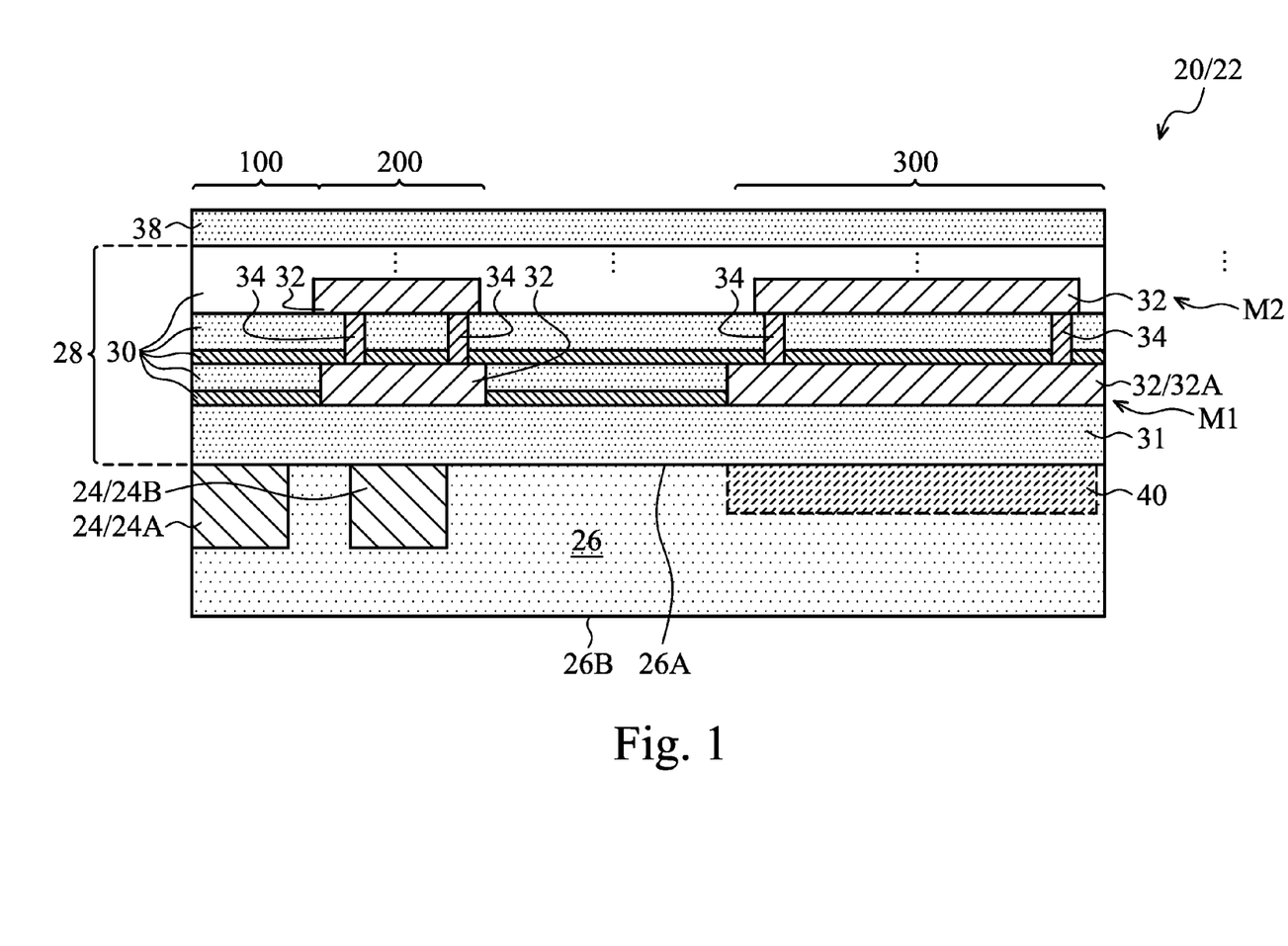
FIGS. 1 through 8 are cross-sectional views of intermediate stages in the manufacturing of a metal shield and a backside metal pad in accordance with some exemplary embodiments, wherein the metal shield and the backside metal pad are formed in a Backside Illumination (BSI) image sensor chip.

FIGS. 1 through 8 illustrate the cross-sectional views of intermediate stages in the manufacturing of the metal shield and the backside metal pad in accordance with some exemplary embodiments. FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed in semiconductor substrate 26. Image sensors 24 are configured to convert light signals (photons) to electrical signals, and may be photo-sensitive diodes or photo-sensitive MOS transistors. Accordingly, the respective wafer 22 may be an image sensor wafer. In some exemplary embodiments, image sensors 24 extend from front surface 26A into semiconductor substrate 26. The structures of image sensors 24A and 24B may be identical to each other.

Front-side interconnect structure 28 is formed over semiconductor substrate 26, and is used to electrically interconnect the devices in image sensor chip 20. Front-side interconnect structure 28 includes Inter-Layer Dielectric (ILD) 31, dielectric layers 30, and metal lines (or pads) 32 and vias 34 in dielectric layers 30. Although not shown, contact plugs are formed in ILD 31. Throughout the description, the metal lines and metal pads 32 in a same dielectric layer 30 are collectively referred to as being a metal layer. Front-side interconnect structure 28 includes metal layers includes M1, M2, etc, wherein metal layer M1 is the bottom metal layer of interconnect structure 28. In some exemplary embodiments, the lower layers in dielectric layers 30 are formed of low-k dielectric materials having low k values, for example, lower than about 3.0. The upper layer(s) in dielectric layer(s) 30 may be formed of low-k dielectric materials or non-low-k dielectric materials having k values greater than 3.9, or greater than about 4.5, for example. Passivation layer 38 is formed over interconnect structure 28. Passivation layer 38 may be formed of a non-low-k dielectric material having a k value greater than 3.9. In some embodiments, passivation layer 38 includes a silicon oxide layer and a silicon nitride layer on the silicon oxide layer.

Image sensor chip 20 includes active image sensor pixel region 100 and black reference pixel region 200. Active image sensor pixel region 100 includes active image sensors 24A formed therein, which is used for generating electrical signals from the sensed light. Although the details of image sensor 24A are not illustrated, there may be a plurality of image sensors 24A that form an active image sensor pixel array, wherein the entirety of the active image sensor pixel array is located in active image sensor pixel region 100. Black reference pixel region 200 includes black reference image sensor 24B formed therein, which is used for generating reference black level signals. Similarly, although the details of image sensor 24B are not illustrated, there may be a plurality of image sensors 24B that form a black level reference pixel array. The entirety of the black level reference pixel array is located in black reference pixel region 200.

Image sensor chip 20 further includes metal pad region 300, in which a backside metal pad will be formed. In some exemplary embodiments, Shallow Trench Isolation (STI)

region 40 is formed in metal pad region 300. In alternative embodiments, there may not be STI region formed in the illustrated metal pad region 300. STI region 40 may extend from front surface 26A of semiconductor substrate 26 into semiconductor substrate 26. Furthermore, metal pad 32A is located in metal pad region 300. Metal pad 32A may be in any metal layer, such as metal layer M1, metal layer M2, or the like, in interconnect structure 28.

Figure 2:
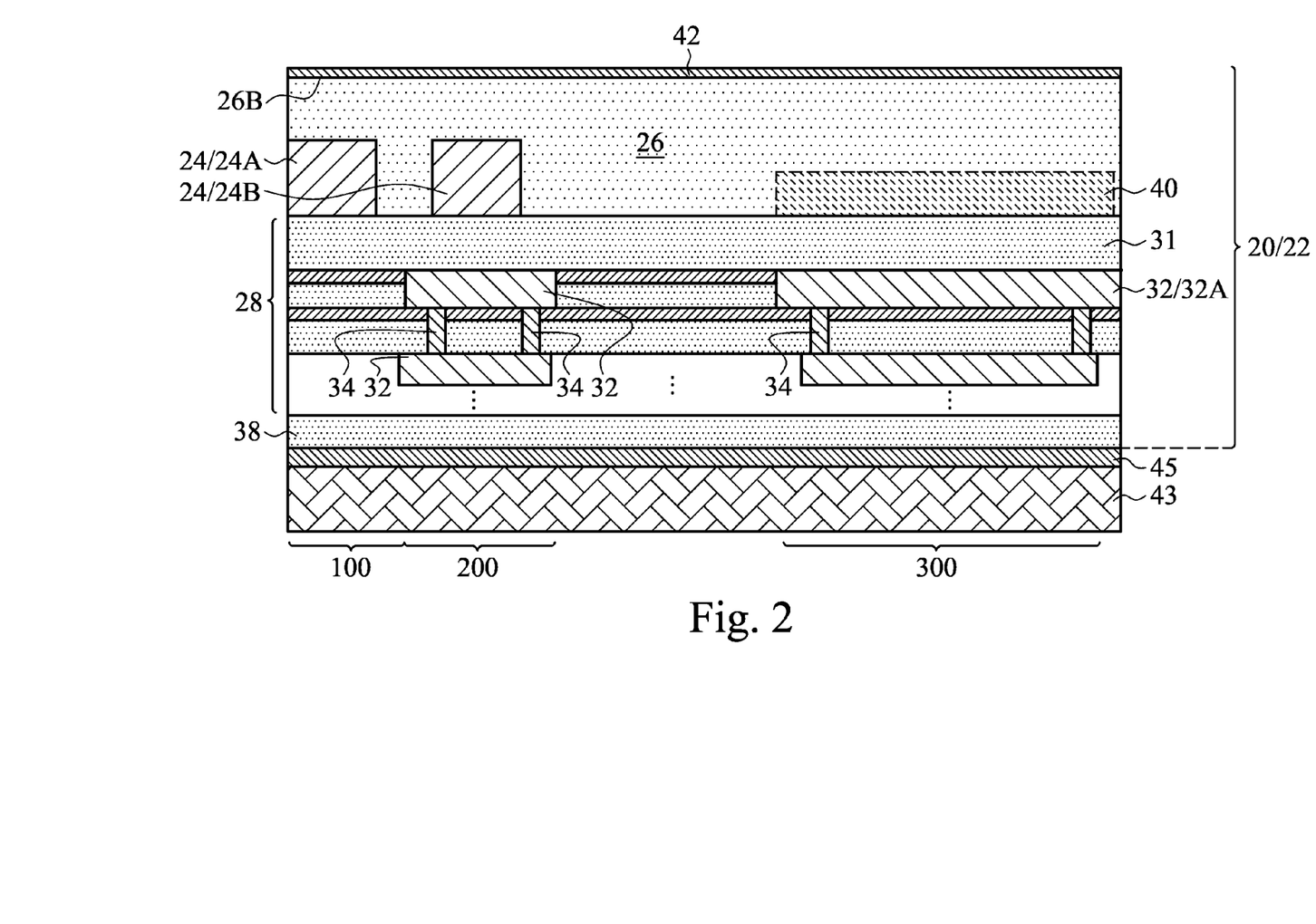

Next, refer to FIG. 2, wafer 22 is flipped over, and the front side of wafer 22 is attached to a carrier 43 through adhesive 45. Accordingly, the top surfaces of each of the features as in FIG. 1 become bottom surfaces in FIG. 2, and vice versa. After the flipping, semiconductor substrate 26 faces up. A backside grinding is then performed to thin semiconductor substrate 26, until the thickness of wafer 22 is smaller than about 30 μm, or smaller than about 5 μm, for example. Back surface 26B of the resulting semiconductor substrate 26 is marked. With semiconductor substrate 26 having a small thickness, light can penetrate from back surface 26B into semiconductor substrate 26 to reach image sensor 24A.

Figure 3:
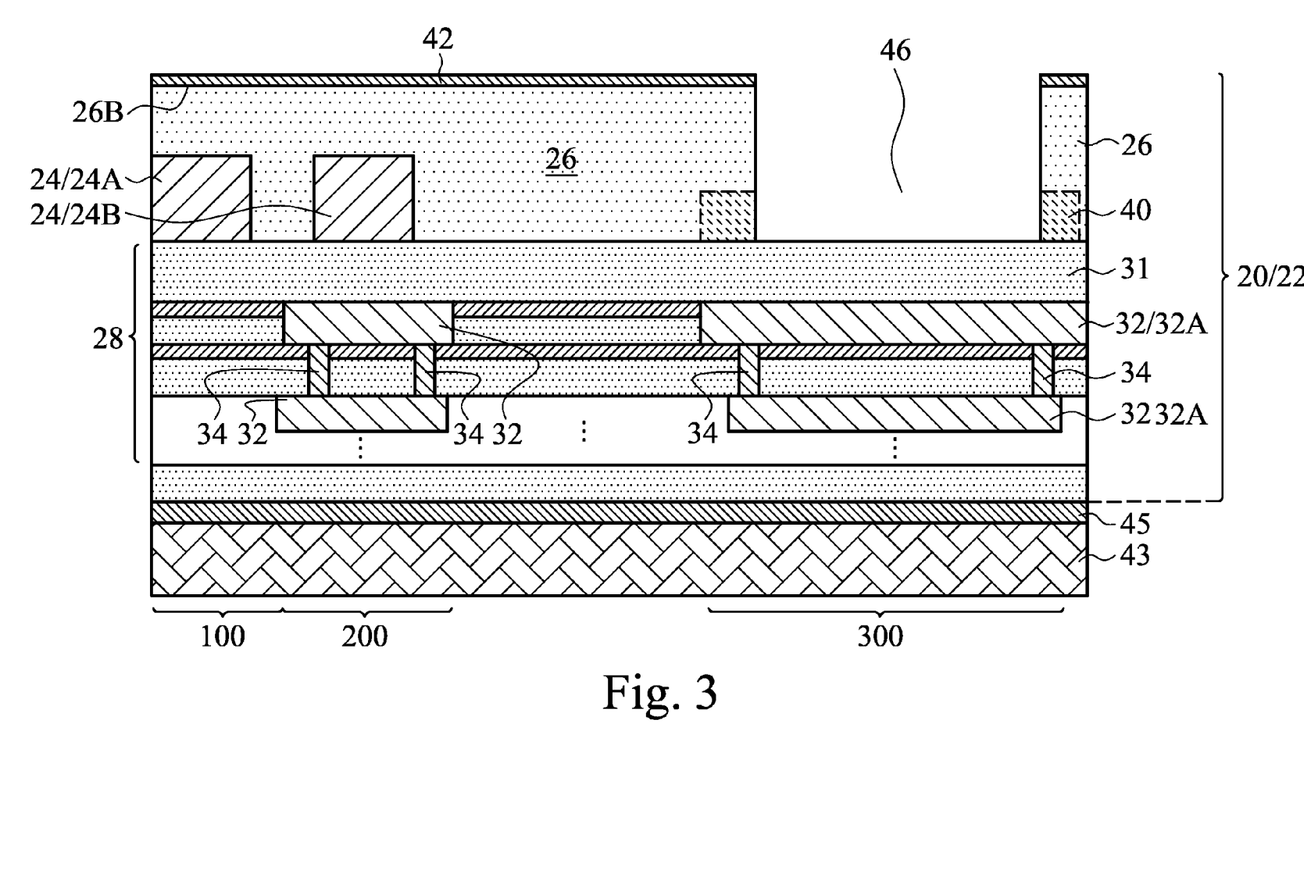

After the step of thinning, Bottom Anti-Reflective Coating (BARC) 42 is formed on back surface 26B of semiconductor substrate 26. In some embodiments, BARC 42 comprises silicon oxynitride (SiON), although other materials may be used. BARC 42 is then used to etch semiconductor substrate 26, so that opening 46 is formed, as shown in FIG. 3. In the etch step, BARC 42 is used as to reduce the effect of the reflection from semiconductor substrate 26. In the embodiments in which STI region 40 is in metal pad region 300, the resulting opening 46 penetrates through STI region 40, with the remaining portion of STI region 40 encircling opening 46. After the etching of semiconductor substrate 26 and STI region 40, the etching is continued to etch dielectric layers such as ILD 31, until metal pad 32A is reached, as shown in FIG. 4.

Figure 4:
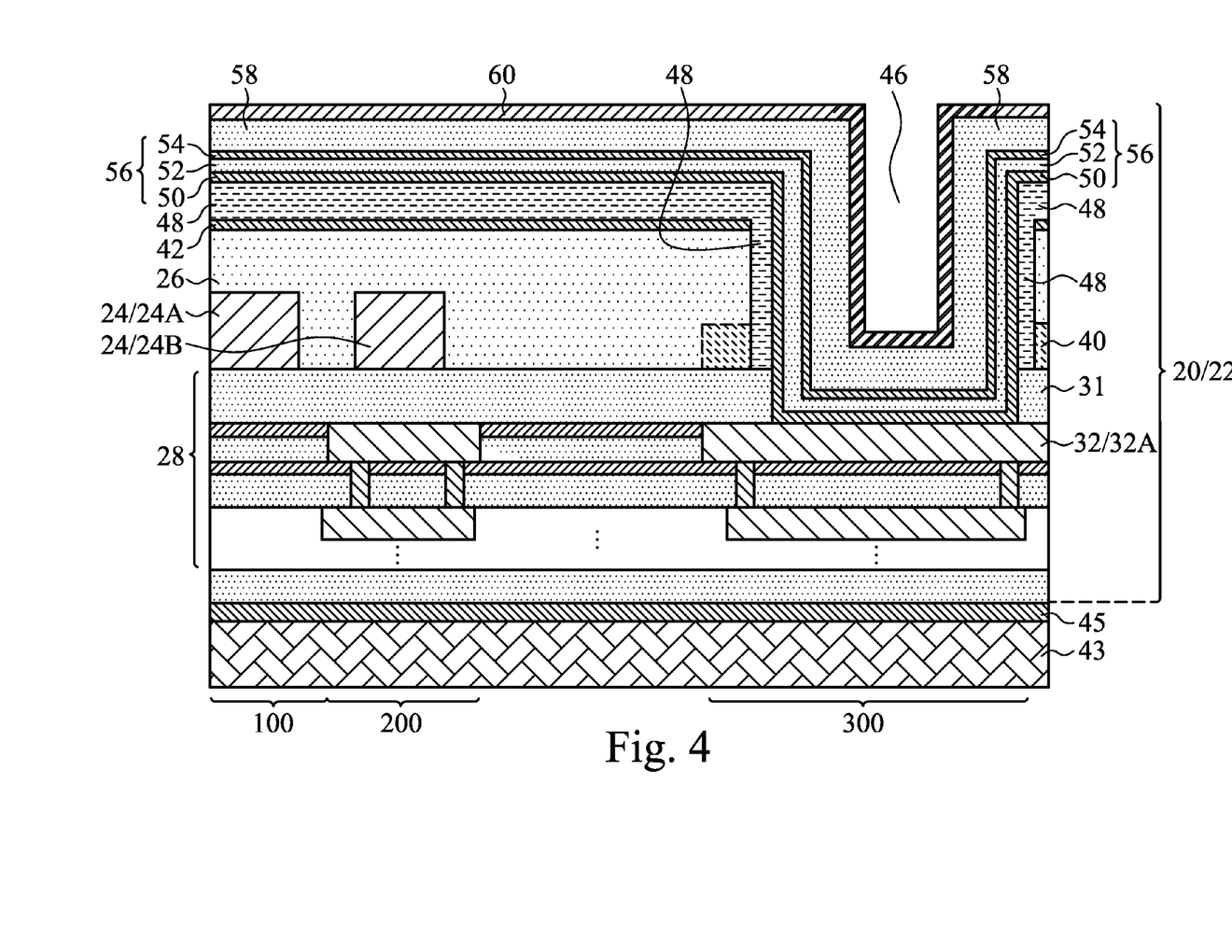

FIG. 4 also illustrates the formation and the patterning of buffer oxide layer 48. Buffer oxide layer 48 may be formed of silicon oxide, for example, although other dielectric materials may be used. The thickness of buffer oxide layer 48 may be between about 500 Å and about 5,000 Å. After the patterning of buffer oxide layer 48, a portion of buffer oxide layer 48 at the bottom of opening 46 is removed, and the sidewall portions of buffer oxide layer 48 remain on the sidewall of opening 46.

FIG. 4 also illustrates the formation of a first conductive layer 56, and second conductive layer 58 over first conductive layer 56. First conductive layer 56 and second conductive layer 58 have an etching selectivity high enough, so that in the subsequent patterning of conductive layer 58, conductive layer 56 may be used as an etch stop layer. In some exemplary embodiments, conductive layer 56 includes barrier/adhesion layer 50, aluminum copper (AlCu) layer 52 over barrier/adhesion layer 50, and conductive etch stop layer 54 over AlCu layer 52. In these embodiments, etch stop layer 54 has an adequate etch selectivity, and is used to stop the etching of conductive layer 58. In some exemplary embodiments, barrier/adhesion layer 50 comprises titanium, titanium nitride, tantalum, tantalum nitride, or multilayers thereof. Conductive etch stop layer 54 may comprise titanium, titanium nitride, tantalum, tantalum nitride, aluminum, copper, nickel, tungsten, and/or other metallic material(s) having enough etching selectivity with conductive layer 58. The thickness of barrier/adhesion layer 50 may be between about 100 Å and about 1,000 Å. The thickness of AlCu layer 52 may be between about 1 KÅ and about 6 KÅ. The thickness of conductive etch stop layer 54 may be between about 100 Å and about 1,000 Å. It is appreciated that the dimensions recited throughout the description are merely examples, and may be changed to different values.

In the illustrative embodiments as shown in FIG. 4, conductive layer 56 includes three layers. In alternative embodiments, conductive layer 56 is a single layer, a dual layer, or may include more than three layers. For example, conductive layer 56 may be a single layer that is formed of a material selected from titanium, titanium nitride, tantalum, tantalum nitride, or the like. The single layer may have its bottom surface contacting metal pad 32A, and its top surface contacting conductive layer 58. In these embodiments, the single layer may have a thickness close to the total thickness of the exemplary layers 50, 52, and 54. Alternatively, conductive layer 56 may include a bottom layer formed of titanium, titanium nitride, tantalum, tantalum nitride, or the like, and an upper layer formed of a material that is selected from the same candidate materials of conductive etch stop layer 54. In these embodiments, the bottom layer may have a thickness equal to the total thickness of layer 50 and 52, or alternatively, the bottom layer and the top layer may have thicknesses close to each other, with the total thickness of the bottom layer and the top layer close to the total thickness of layers 50, 52, and 54.

Conductive layer 58 may be formed of AlCu, although other metallic materials and alloys may be used. The thickness of conductive layer 58 may be between about 3 KÅ and about 15 KÅ, for example. After the formation of conductive layer 58, BARC layer 60 is formed, which may comprise SiON, for example.

Figure 5:
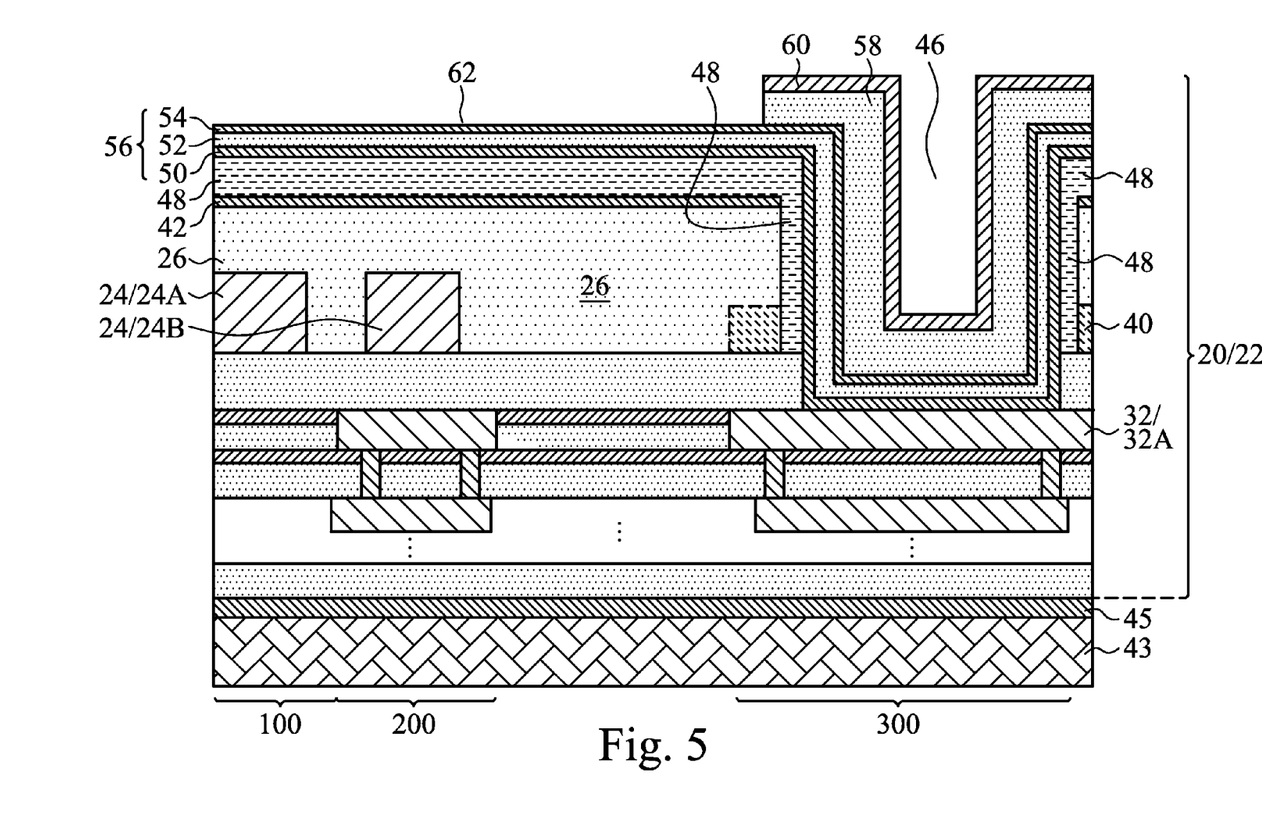

Next, referring to FIG. 5, a patterning step is performed to remove the portions of conductive layer 58 from active image sensor pixel region 100 and black reference pixel region 200. The portion of conductive layer 58 in metal pad region 300 remains. In the patterning step, conductive layer 56 (for example, etch stop layer 54 in conductive layer 56) is used as the etch stop layer, and conductive layer 56 (including etch stop layer 54) is not etched, although a slight over etch may cause the thinning of etch stop layer 54.

Figure 6:
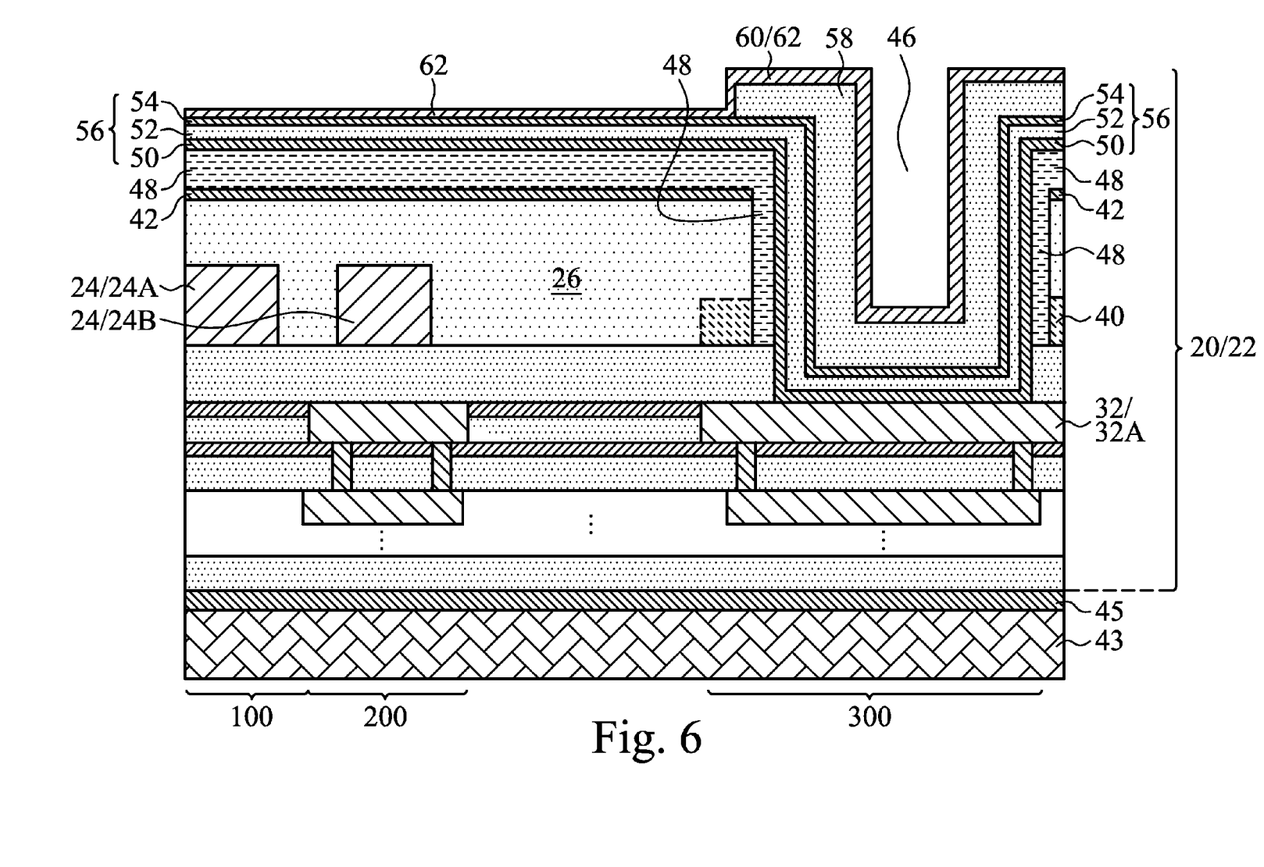

Referring to FIG. 6, an additional BARC layer 62 is formed. In device regions 100 and 200, BARC layer 62 is formed on conductive layer 54. In device region 300, BARC layer 62 is formed on the remaining portion of BARC layer 60, and the resulting combined BARC layer in device region 300 is referred to as BARC layer 60/62 hereinafter.

Figure 7:
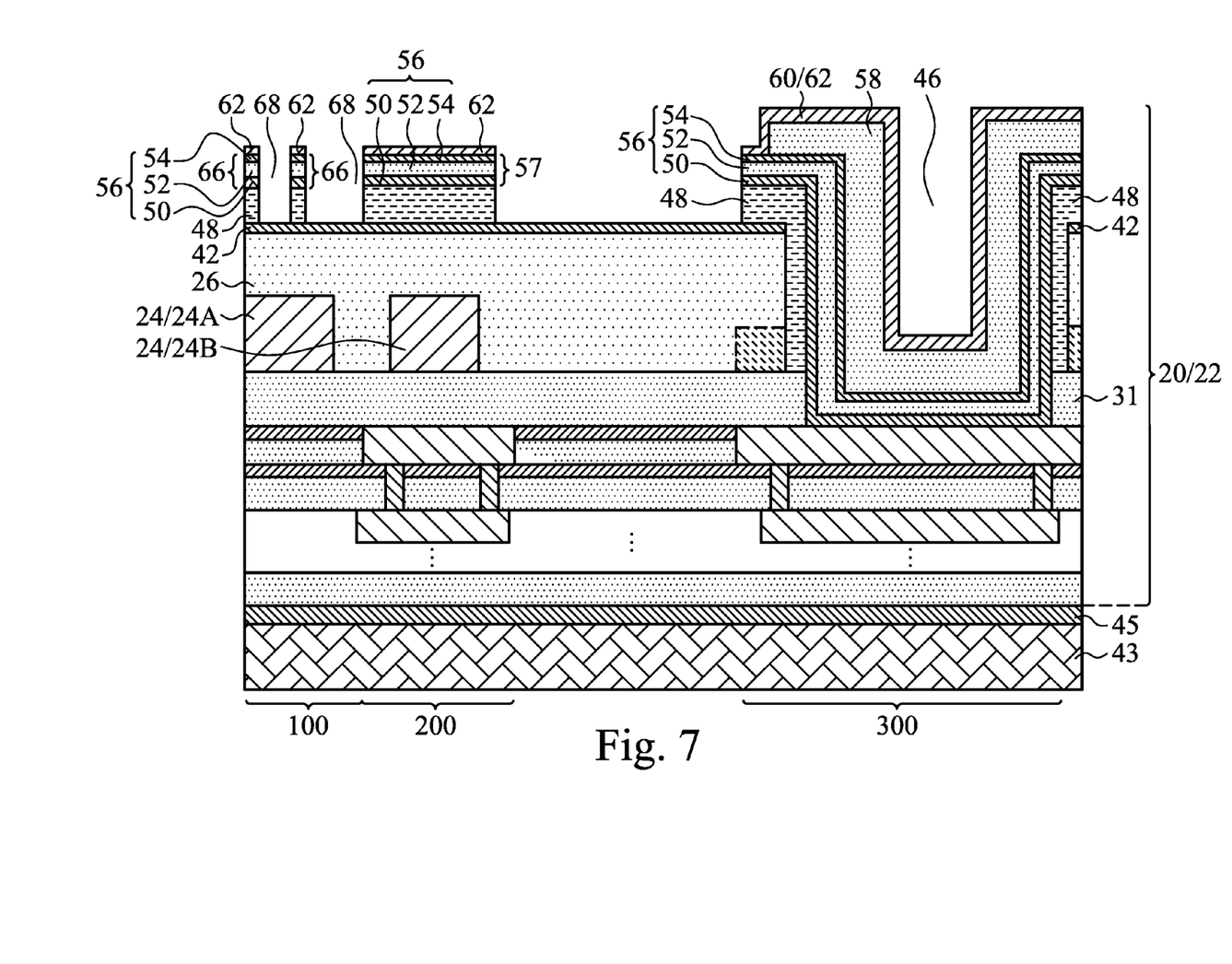

FIG. 7 illustrates the further patterning of conductive layer 56, in which BARC layer 62 is used to reduce the effect of the reflection from conductive layer 56. The etch may be performed until buffer oxide layer 48 or BARC layer 42 is exposed. In the patterning step, black reference pixel region 200 and metal pad region 300 are protected from etching, and the layers therein are not etched. The remaining portion of conductive layer 56 in device region 200 is used as a metal shield (referred to as metal shield 57 hereinafter). Metal shield 57 is used to block the light that otherwise will be received by black reference image sensors 24B. In some embodiments, some portions of conductive layer 56 in active image sensor pixel region 100 are left to form metal grid 66. The portions of conductive layer 56 between metal grid 66 are etched to form openings 68. Active image sensors 24A are aligned to the openings 68 between metal grid 66. In alternative embodiments, the entirety of conductive layer 56 in device region 100 is removed.

Figure 8:
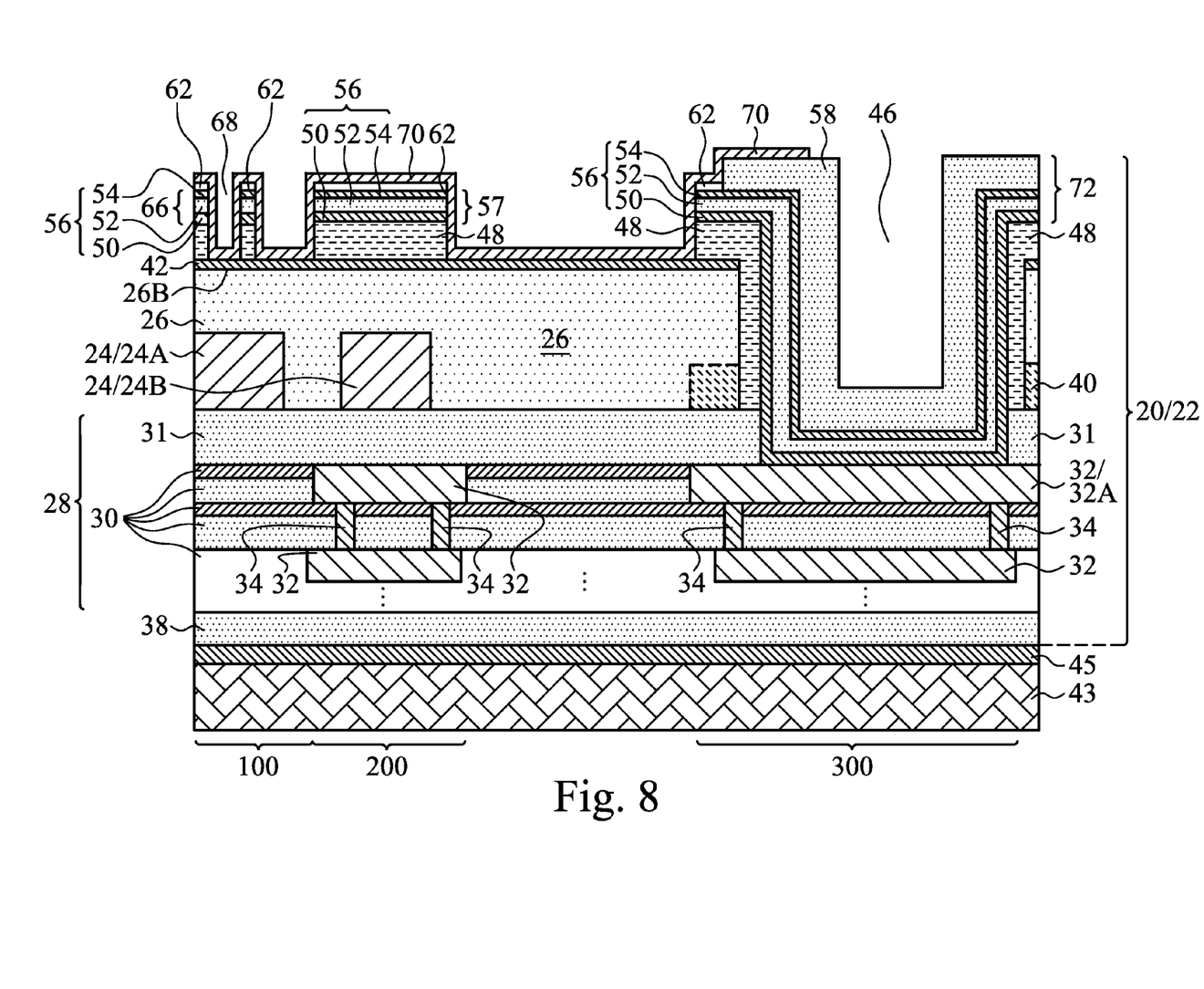

FIG. 8 illustrates the formation of passivation layer 70. In some embodiments, passivation layer 70 includes a silicon oxide layer and a silicon nitride layer over the silicon oxide layer, for example, although other materials may be used. Passivation layer 70 is patterned, and the remaining portion of passivation layer 70 protects device regions 100 and 200, and is removed from device region 300, so that conductive layer 58 is exposed. Furthermore, some portions of BARC layers 60 and 62 are also removed from device region 300. In device region 300, the portion of conductive layer 58 and 56 therein in combination act as backside metal pad 72, which is electrically connected to metal pad 32A. Backside metal pad 72 may be used for bonding BSI chip 20 to other devices or chips, or may be used for probing in the testing of chip 20.

In subsequent processes, remaining components of BSI chip 20, including color filters (not shown), micro-lenses (not shown), and the like, are formed. Each of the color filters and the micro-lenses may be aligned to one of active image sensors 24A. Active image sensors 24A may thus receive the filtered light.

In the embodiments, conductive layer 58 is deposited before patterning the underlying metal layer 56. The portions of conductive layer 58 in device region 200 are then removed from device regions 100 and 200. In the formation and the patterning of conductive layer 58, since conductive layer 56 has not been patterned yet, image sensors 24 are protected by conductive layer 56 from damage, which damage is caused by the plasma used in the deposition and the etching of conductive layer 58. Furthermore, since buffer oxide layer 48 is not exposed in the patterning of conductive layer 58, and is etched at most once when conductive layer 56 is patterned, the thickness of buffer oxide layer 48 may be reduced without the concern of being over etched. Reducing the thickness of buffer oxide layer 48 results in the desirable reduction in the step heights caused by buffer oxide layer 48. The reduction in the step height is beneficial for the subsequent formation of micro-lenses and color filters.

In accordance with embodiments, a method includes forming an opening in a semiconductor substrate, wherein the opening extends from a back surface of a semiconductor substrate to a metal pad on a front side of the semiconductor substrate. A first conductive layer is formed on a backside of the semiconductor substrate, wherein the first conductive layer extends into the opening to contact the metal pad. A second conductive layer is formed over the first conductive layer, wherein the first and the second conductive layers include different materials. A first patterning step is performed to remove the second conductive layer from a first device region and a second device region, wherein a portion of the second conductive layer over the metal pad remains after the first patterning step, and wherein the first conductive layer is used as an etch stop layer in the first patterning step. A second patterning step is performed to remove portions of the first conductive layer from the first device region, wherein a portion of the conductive layer in the second device region remains after the second patterning step to form a metal shield, and wherein the metal shield overlaps a black reference image sensor.

In accordance with other embodiments, a method includes forming an opening extending from a back surface of a semiconductor substrate to a metal pad on a front side of the semiconductor substrate, and forming a first conductive layer. The first conductive layer includes a first portion overlapping active image sensors in the semiconductor substrate, a second portion overlapping black reference image sensors in the semiconductor substrate, and a third portion extending into the opening to contact the metal pad. A second conductive layer is formed over and contacting the first conductive layer. A first patterning step is performed to remove the first and the second portions of the second conductive layer, wherein the first conductive layer is used as an etch stop layer in the first patterning step. A second patterning step is performed to remove a portion of the first portion of the first conductive layer. The second portion and the third portion of the first conductive layer remain after the second patterning step.

In accordance with yet other embodiments, a device includes a semiconductor substrate, a black reference image sensor in the semiconductor substrate, and a metal pad on a front side of, and underlying, the semiconductor substrate. The device further includes a first conductive layer, which includes a first portion penetrating through the semiconductor substrate to connect to the metal pad, and a second portion overlapping the black reference image sensor. A second conductive layer is disposed over and contacting the first portion of the first conductive layer. A dielectric layer is disposed over and contacting the second portion of the first conductive layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming an opening in a semiconductor substrate, wherein the opening extends from a back surface of a semiconductor substrate to a metal pad on a front side of the semiconductor substrate;
    forming a first conductive layer on a backside of the semiconductor substrate, wherein the first conductive layer extends into the opening to contact the metal pad;
    forming a second conductive layer over the first conductive layer, wherein the first and the second conductive layers comprise different materials;
    performing a first patterning step to remove the second conductive layer from a first device region and a second device region, wherein a portion of the second conductive layer over the metal pad remains after the first patterning step, and wherein the first conductive layer is used as an etch stop layer in the first patterning step; and
    performing a second patterning step to remove portions of the first conductive layer from the first device region, wherein a portion of the conductive layer in the second device region remains after the second patterning step to form a metal shield, and wherein the metal shield overlaps a black reference image sensor.

2. The method of claim 1, wherein the step of forming the first conductive layer comprises:
    forming a conductive barrier layer to contact the metal pad;
    forming an aluminum copper layer over the conductive barrier layer; and
    forming a conductive etch stop layer over the aluminum copper layer, wherein the second conductive layer is in contact with the conductive etch stop layer.

3. The method of claim 1, wherein the step of forming the first conductive layer comprises forming a single conductive layer comprising a bottom surface contacting the metal pad and a top surface contacting the second conductive layer.

4. The method of claim 1, wherein the step of forming the first conductive layer comprises:
    forming a conductive barrier layer to contact the metal pad; and
    forming a conductive etch stop layer over and contacting the conductive barrier layer, wherein the conductive etch stop layer comprises top surface contacting the second conductive layer.

5. The method of claim 1, wherein after the second patterning step, portions of the first conductive layer in the first device region remain to form a metal grid.

6. The method of claim 1, wherein after the second patterning step, an entirety of the first conductive layer in the first device region is removed, and wherein the first device region comprises a plurality of active image sensors therein.

7. The method of claim 1 further comprising, after the second patterning step:
    blanket forming a passivation layer comprising:
        a first portion and a second portion in the first and the second device regions, respectively; and
        a third portion overlapping the metal pad; and
    removing the third portion of the passivation layer, wherein the first and the second portions of the passivation layer are not removed.

8. A method comprising:
    forming an opening extending from a back surface of a semiconductor substrate to a metal pad on a front side of the semiconductor substrate;
    forming a first conductive layer, wherein the first conductive layer comprises:
        a first portion overlapping active image sensors in the semiconductor substrate;
        a second portion overlapping black reference image sensors in the semiconductor substrate; and
        a third portion extending into the opening to contact the metal pad;
    forming a second conductive layer over and contacting the first conductive layer;
    performing a first patterning step to remove the first and second portions of the second conductive layer, wherein the first conductive layer is used as an etch stop layer in the first patterning step; and
    performing a second patterning step to remove a portion of the first portion of the first conductive layer, wherein the second portion and the third portion of the first conductive layer and a portion of second conductive layer overlapping the third portion of the first conductive layer remain after the second patterning step.

9. The method of claim 8, wherein the step of forming the first conductive layer comprises:
    forming an aluminum copper layer over the metal pad; and
    forming a conductive etch stop layer over the aluminum copper layer, wherein the first patterning step stops on the conductive etch stop layer.

10. The method of claim 8, wherein the step of forming the first conductive layer comprises forming a single conductive layer contacting the metal pad and the second conductive layer, wherein the first patterning step stops on the single conductive layer.

11. The method of claim 8, wherein the step of forming the first conductive layer comprises:
    forming a conductive barrier layer to contact the metal pad; and
    forming a conductive etch stop layer over and contacting the conductive barrier layer, wherein the first patterning step stops on the conductive etch stop layer.

12. The method of claim 8, wherein after the second patterning step, portions of the first portion of the first conductive layer remain to form a metal grid.

13. The method of claim 8 further comprising, after the second patterning step:
    blanket forming a passivation layer overlapping the active image sensors and the black reference image sensors, wherein the third portion of the second conductive layer is exposed through the passivation layer.

14. A device comprising:
    a semiconductor substrate;
    a black reference image sensor in the semiconductor substrate;
    a metal pad on a front side of, and underlying, the semiconductor substrate;
    a first conductive layer comprising:
        a first portion penetrating through the semiconductor substrate to connect to the metal pad; and
        a second portion overlapping the black reference image sensor;
    a second conductive layer over and contacting the first portion of the first conductive layer; and
    a dielectric layer over and contacting the second portion of the first conductive layer.

15. The device of claim 14, wherein the second conductive layer comprises aluminum copper.

16. The device of claim 14, wherein the first conductive layer comprises:
    a conductive barrier layer contacting the metal pad;
    an aluminum copper layer overlying the conductive barrier layer; and
    a conductive etch stop layer over the aluminum copper layer.

17. The device of claim 14, wherein the first conductive layer comprises a single conductive layer, wherein a bottom surface of the single conductive layer is in physical contact with the metal pad, and wherein a top surface of the single conductive layer is in physical contact with the second conductive layer.

18. The device of claim 14, wherein the first conductive layer comprises:
    a conductive barrier layer contacting the metal pad; and
    a conductive etch stop layer overlying and contacting the conductive barrier layer, wherein the conductive etch stop layer and the second conductive layer comprise different materials, and wherein the conductive etch stop layer and the conductive barrier layer comprise different materials.

19. The device of claim 14 further comprising an active image sensor array, wherein the first and the second conductive layers do not extend to the region overlapping the active image sensor.

20. The device of claim 14 further comprising an active image sensor array, wherein the first conductive layer extends overlying the image sensor array to form a metal grid.

* * * * *